(12) United States Patent
Kaneko et al.

(10) Patent No.: US 7,250,326 B2
(45) Date of Patent: Jul. 31, 2007

(54) SUBSTRATE WITH AN ELECTRODE AND METHOD OF PRODUCING THE SAME

(75) Inventors: Naomi Kaneko, Kyoto (JP); Naohide Wakita, Suita (JP); Hiroshi Satani, Yawata (JP); Tsuyoshi Uemura, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 130 days.

(21) Appl. No.: 10/715,854

(22) Filed: Nov. 19, 2003

(65) Prior Publication Data

US 2004/0104121 A1   Jun. 3, 2004

Related U.S. Application Data

(62) Division of application No. 10/088,235, filed as application No. PCT/JP01/06293 on Jul. 19, 2001, now Pat. No. 6,677,062.

(30) Foreign Application Priority Data

| Jul. 19, 2000 | (JP) | ............................. 2000-218527 |
| Sep. 27, 2000 | (JP) | ............................. 2000-293812 |
| Oct. 5, 2000 | (JP) | ............................. 2000-305823 |

(51) Int. Cl.
   *H01L 21/00* (2006.01)
(52) U.S. Cl. .............................. 438/98; 438/22; 438/30
(58) Field of Classification Search ................ 438/608, 438/609, 29, 69, 70, 99, 30, 39, 22, FOR. 407, 438/FOR. 408, 98; 257/E51.026, E51.018, 257/33.001, E33.06, E33.064, E31.126
See application file for complete search history.

(56) References Cited

U.S. PATENT DOCUMENTS

| 5,677,240 | A | * | 10/1997 | Murakami et al. .......... 438/609 |
| 6,110,347 | A | | 8/2000 | Arao et al. ................. 205/333 |
| 6,310,674 | B1 | * | 10/2001 | Suzuki et al. ............... 349/139 |
| 6,522,382 | B1 | * | 2/2003 | Rudin ......................... 349/143 |

FOREIGN PATENT DOCUMENTS

| EP | 0 461 908 A2 | 12/1991 |
| JP | 63-231318 | 9/1988 |
| JP | 4-48516 | 2/1992 |
| JP | 05-346575 | 12/1993 |
| JP | 07-079003 | 3/1995 |
| JP | 08-194230 | 7/1996 |
| JP | 09-061836 | 3/1997 |
| JP | 09-283468 | 10/1997 |
| JP | 2000-222944 | 8/2000 |
| WO | WO00/51139 | 8/2000 |

* cited by examiner

*Primary Examiner*—George Fourson
*Assistant Examiner*—Julio J. Maldonado
(74) *Attorney, Agent, or Firm*—Steptoe & Johnson LLP

(57) ABSTRACT

The present invention provides a method of forming a transparent conductive film at a low temperature that is suitable for use with a synthetic resin substrate. According to the production method of a substrate with an electrode of the present invention, an oxide conductive film composed of an amorphous material or mainly composed of an amorphous material is formed on a substrate at a temperature equal to or less than the crystallization temperature of the film, and subsequently, the formed oxide conductive film is crystallized by heating. The oxide conductive film is processed into the shape of an electrode either before or after crystallization, according to necessity.

16 Claims, 4 Drawing Sheets

SUBSTRATE WITH AN ELECTRODE AND METHOD OF PRODUCING THE SAME

TECHNICAL FIELD

The present invention relates to a substrate having an electrode on a surface thereof and more particularly, to an improvement in a method for forming an electrode on a substrate.

BACKGROUND ART

In display devices such as liquid crystal display (LCD), electrochromic display (ECD), plasma display (PDP), and electroluminescent display (ELD) devices and in metal-insulator-semiconductor (MIS) solar cells, transparent electrodes are generally formed on the surface of a substrate made of glass or the like. A transparent film with low resistance can be obtained using a metal such as silver, but in order to ensure sufficient light transmissivity, it is necessary to form an extremely thin film having a thickness of approximately 10 nm. Difficulties, however, arise in the handling of such a thin film, as such a film can be easily damaged in subsequent steps such as in a step of patterning the electrodes. For these reasons, an oxide conductive material such as zinc oxide, indium oxide, or tin doped indium oxide (ITO), which although has a high resistivity in comparison to metal, has a high hardness and is not particularly susceptible to deterioration in function caused by oxide degradation, is used for the transparent electrodes formed on a substrate. In particular, films made of ITO are widely used because of the low resistivity thereof. In ITO, $Sn^{4+}$, which substitutes for $In^{3+}$ in oxide indium $In_2O_3$, generates a carrier electron. As is the case with indium oxide, the crystal structure is a cubic bixbyite structure. For the formation of an ITO film, sputtering, which enables the formation of a low resistance film on a substrate with a large area at a relatively low temperature, is generally employed. The characteristics of a film formed by sputtering vary according to the substrate temperature during formation. A film formed at a high temperature of approximately 200° C. or higher is a so-called polycrystalline film made up of an aggregate of microcrystal. In such a film formed at a high temperature, microcrystals in each of certain regions orient in substantially the same direction, thereby forming domains. A temperature of 250° C. has been determined to be the substrate temperature at which a film having both the highest possible transparency and the lowest possible resistance can be obtained. By contrast, a film formed at a low temperature is amorphous or has a structure mainly in an amorphous phase with crystal fine grains being dispersed therein. While an amorphous film has excellent etchability for the processing of electrodes, fundamental characteristics such as conductivity and transparency are inferior to those of a polycrystalline film. Chemical resistance and corrosion resistance are also inferior. In a film that is a mixture of the amorphous phase and the crystal phase, linearity of film patterning is poor because the etching speed for each phase differs greatly. In, for example, cases in which crystal grains are dispersed in an amorphous matrix, it is only the crystal phase that is not etched, remaining as residue and becoming a cause of defects. In addition, because most of the film is the amorphous phase, the film is inferior in terms of a variety of properties such as conductivity, transmissivity, chemical resistance, corrosion resistance, and durability.

For example, in Japanese Unexamined Patent Publication No. 4-48516, it is proposed that, for the transparent electrodes, an ITO film or an indium oxide film, each being oriented in a specified direction and having excellent patternability for etching, be employed. In the same publication, an amorphous film is proposed as an electrode material having excellent patternability for etching. While an amorphous film has excellent etchability, it is inferior in terms of fundamental characteristics such as conductivity and transparency. In Japanese Unexamined Patent Publication No. 8-94230, a randomly-oriented polycrystalline ITO film formed by sputtering at a substrate temperature of 180-350° C. is proposed as a transparent conductive film having excellent etchability.

As in the above examples, polycrystalline films for electrodes have conventionally been formed by sputtering with the substrate temperature fixed at a high temperature of 200° C. or higher. Thus, it was necessary to employ a substrate made of a material capable of withstanding a high temperature of 200° C. or higher during formation of a film, such as a substrate made of glass.

In recent years, many attempts have been made to use a substrate made of a synthetic resin rather than a substrate made of glass, as a synthetic resin substrate has the advantages of being light weight and difficult to break. However, synthetic resin substrates can withstand at most a temperature of 180° C. Therefore, it is not possible to form, on a surface of the substrate, a transparent conductive film made of an oxide such as ITO or zinc oxide at high temperatures of 200° C. or higher. Namely, electrodes formed on a synthetic resin substrate had to be either a film in which the amorphous phase and the crystal phase are mixed or a film in the amorphous phase. In Japanese Unexamined Patent Publication No. 9-61836, a method is proposed wherein, by mixing $H_2O$ in a sputtering gas, an ITO thin film having excellent etchability and a low density of crystal grains dispersed in an amorphous matrix is formed on a synthetic resin substrate. This film, however, also is inferior to a polycrystalline film formed at a high temperature in terms of conductivity and transparency.

In Japanese Unexamined Patent Publication No. 5-346575, a method is proposed wherein resistance is improved by using vapor deposition to form an ITO film on a synthetic resin substrate at a temperature below the temperature at which the substrate undergoes a change in shape and calcining the film in air to adjust the degree of oxidization. However, with this method also, fundamental characteristics such as resistivity and transmissivity are insufficient in the resulting film.

The temperature of heating is limited, not only in cases where substrates made of synthetic resin are used, but also in cases where a color filter layer and a light-emitting layer made of an organic material are provided on a same substrate. For example, a transparent conductive film for use as the electrodes of a super twisted nematic (STN) mode color LCD is formed on a color filter made of organic material. The substrate temperature during the forming of this transparent conductive film is limited to approximately 200° C. or less due to the presence of the color filter material.

Thus, there has been a need for a method of forming, at a low temperature, a conductive film that has excellent resistivity, transmissivity, etchability, and the like.

In addition, because of the difference in the thermal expansion coefficient of a substrate and a conductive thin film formed on the surface of the substrate, the substrate is susceptible to bend. When bend arises in a substrate, precision in the processing of the formed conductive thin film into electrodes is reduced. The higher the temperature during formation of the conductive thin film, the larger the bend becomes. In other words, when the film is formed at a low temperature, while bend in the substrate is minimal, a film with sufficient characteristics cannot be obtained. In amorphous silicon (a-Si) solar cells in which a transparent conductive film, an amorphous silicon layer, and an aluminum electrode layer are stacked on a substrate, in organic ELDs in which a pair of electrode layers and an organic light-emitting layer sandwiched therebetween are stacked on a substrate, and the like, precision in the processing of other layers stacked on the conductive thin films suffers. In any case, in order to obtain a high wiring density and a stable internal resistance, it is absolutely necessary that such a bend be reduced. In particular, in a-Si solar cells, which are set up outside, good reliability and durability are required, making bend a serious problem.

Synthetic resin substrates are more susceptible to bend than are glass substrates. For this reason, the formation of conductive thin films on synthetic resin substrates has conventionally been carried out in the relatively low range of from room temperature to 150° C. In order to meet the demand for a reduction in the size, a reduction in the weight, and an improvement in light transmissivity of display panels, it is necessary that the thickness of the substrates be reduced. At the same time, in order to reduce the internal resistance of a circuit, it is necessary that the thickness of conductive films for electrodes and the like be increased. Thus, as reduction in the size and improvement in the performance of devices progress, the more serious a problem bend in substrates and fractures and the like that arise along with bend become.

In Japanese Unexamined Patent Publication No. 2000-222944, a method of forming a low stress and low resistance ITO film is proposed with the aim of preventing fractures in the thin film. In this method, under the condition that the substrate temperature be approximately 200° C., a polycrystalline film made up of an aggregate of polygonal column-shaped crystal grains is formed by ion plating with arc discharge plasma. Although this method is effective for preventing fractures in the thin film, it is not effective for suppressing the bend in a substrate that arises with heating at a high temperature. It is also difficult to use this method for forming a film at a low temperature on a substrate made of synthetic resin. Thus, there has been a need for a method of forming, at a low temperature, a conductive thin film having excellent resistivity, transmissivity, etchability, and the like, that does not also bring about a change in the shape of the substrate.

DISCLOSURE OF THE INVENTION

In order to overcome the foregoing problems, it is an object of the present invention to provide a method of forming, at a low temperature, a conductive film that is especially useful when utilizing a synthetic resin substrate and that is excellent in terms of a variety of properties such as resistivity, transmissivity, chemical resistance, corrosion resistance, patternability, and adhesion. It is another object of the present invention to provide a method of forming a conductive film wherein the forming of the film on a substrate renders a substrate in which bend is small.

According to a method of producing a substrate with an electrode of the present invention, an oxide conducive film composed of an amorphous material or mainly composed of an amorphous material is formed on a substrate at a temperature equal to or less than the crystallization temperature of the film, and subsequently the formed oxide conductive film is crystallized by heating. The oxide conductive film is processed into the shape of an electrode either before or after the crystallization, according to necessity.

According to the present invention, crystals in the film are grown in a step subsequent to film formation, making it possible to form the film at a low temperature. The amount of stress that arises in the formed film is dependant on the degree of change in shape of the substrate during formation of the film, i.e., the substrate temperature. Formation of the film at an even lower temperature is effective for suppressing bend in the substrate. Preferably, the film is formed at a temperature of 150° C. or less, because a substrate with an electrode having a small bend, excellent adhesion, and high reliability can thereby be obtained, owing to the fact that internal stress in the transparent conductive film caused by the change in shape of the substrate with heating is small. In particular, when a synthetic resin substrate, which is susceptible to change in shape, is used, it is possible to significantly reduce bend in the substrate by forming the film at normal temperature.

The crystallization of the oxide conductive film is carried out by heating the oxide conductive film It is not always necessary to carry out crystallization at a temperature equal to or higher than the crystallization temperature. From the standpoint of the amount of time required for the treatment, the crystallization is preferably carried out at a temperature equal to or less than the maximum temperature the substrate can withstand, such as the glass transition temperature of the substrate, specifically a temperature in the range of 150° C.-200° C., though it is also possible to carry out the crystallization at a temperature less than this temperature range. It is, of course, preferable that the temperature be equal to or higher than the substrate temperature during the formation of the film. The step of crystallizing the oxide conductive film may be carried out under an atmosphere containing oxygen or an atmosphere not containing oxygen.

The oxide conductive film formed on the substrate is made of, for example, indium oxide or indium oxide having a portion substituted by tin (ITO). In order to effectively crystallize the oxide conductive film at a low temperature, the film is made to have a tin oxide content of less than 5% by weight. When the added amount of tin is made small, the crystallization temperature is reduced, thereby making it possible to even more effectively carry out the crystallization treatment at a low temperature. In conventional production of a thin film by sputtering, a low tin oxide content results in an increased resistivity, but in the present invention, crystallization of the film is brought about by a treatment carried out after film formation, making it possible to obtain an ITO film having a low resistivity even when the tin oxide content is low.

The size of a single crystal grain after crystallization is determined by the crystal state of the film immediately after formation of the film on the substrate, in other words, by the size of the fine crystal grains dispersed in the amorphous matrix and the dispersion density. In order to form a polycrystalline film that has an average grain size of 20-300 nm and random orientation and that has excellent transmissivity, conductivity, etchability, and the like, and low internal stress, it is desirable that the oxide conductive film have a structure wherein, at the stage immediately after the formation of the film on the substrate, crystal grains having an average grain size of 200 nm or less are dispersed in an amorphous matrix. Modification in the size of crystal grains dispersed in the amorphous matrix and the dispersion density is made possible by varying conditions such as substrate temperature, gas pressure, and production speed during formation of the film. These conditions are determined according to electrode material.

The present invention is particularly useful for the production of a substrate with an electrode that utilizes a synthetic resin substrate with which formation of a film at a low temperature is required.

It is preferable that an undercoat layer made of an organic material be provided on a surface of a substrate to relieve stress caused by the difference in the coefficient of thermal expansion between the substrate and the electrode formed thereon.

Forming a transparent coating film containing a synthetic resin on the surface of the completed electrode is effective for suppressing bend in a substrate. As long as the volume resistance of this transparent coating film is $10^2$-$10^{12}$ Ω·cm or less, damage to electrode function is substantially non-existent. Because a substrate provided with a transparent coating film is not susceptible to bend even with a change in temperature, use of a substrate of the present invention for substrates of display panels such as LCD and organic ELD panels makes a high quality display in a wide temperature range possible. It should be noted that providing the transparent coating film so as to cover the electrode prevents damage to the electrode in subsequent steps, thereby making it possible to use conductive materials other than oxide conductive materials, such as metal, for the electrode material. In particular, when an extremely thin metal film is used for a transparent electrode or a translucent electrode, the film formed on the surface of this metal film serves as a protection film for preventing damage to the metal film in subsequent steps.

For example, a resist is used for the transparent coating film that is formed on the surface of the electrode. A resist layer containing a light-curing resin is formed on the completed conductive film, regions corresponding to an electrode pattern for processing the oxide conductive film are cured by exposure to thus form the transparent coating film, and the oxide conductive film is etched using the cured transparent coating film as a resist. The etching thus makes it possible to form a transparent coating film that covers the electrode and has a shape that substantially conforms to that of the electrode, simultaneously with processing the conductive film into electrode. In this way, it is not necessary to add an additional step in order to form a transparent coating film. A step of removing the resist may also be omitted.

Use of a light-curing resin in which conductive powder is dispersed makes it possible to obtain a transparent conductive film having a desired volume resistance.

When the thickness of the transparent coating film is 0.5-5 μm, a good display is possible even if a substrate having such a film formed thereon is utilized as the substrates for a liquid crystal panel.

A substrate with an electrode of the present invention comprises a substrate and an electrode made of an oxide conductive film disposed on the substrate, the electrode being composed of a polycrystalline film having an average grain size of 25 nm or larger, preferably 40 nm or larger, where a crystal is the largest constitutional unit having a boundary identifiable by surface observation. In other words, the polycrystalline film does not have so-called domains, aggregates of crystal having a substantially aligned orientation direction. In such a film, because stress arising in the conductive film is small compared to conventional transparent conductive films having grains, the film is not particularly susceptible to cracks and fractures caused by stress. Bend in the substrate is also small.

In particular, in comparison to an amorphous film, a conductive film with which a clear diffraction peak has been confirmed by X-ray analysis, verifying an average crystal grain size of 20 nm or larger, has a low resistance, excellent transmissivity, excellent chemical resistance, and excellent corrosion resistance. In addition, the film does not have uneven distortion, and thus has excellent linearity in patterning. The average grain size of the crystals is preferably 300 nm or less.

When the thickness of the electrodes is as thin as less than 15 nm, the progress of the crystallization by heating is particularly slow. On the other hand, when crystallization is carried out at a high temperature on a thick film having a thickness that exceeds 1,500 nm, breaks and fractures are more likely to arise. Furthermore, such crystallization deepens corrugations in the surface of the film. Therefore, in order to ensure sufficient conductivity while more effectively preventing fractures in the film and bend in the substrate, it is preferable that the thickness of the formed oxide conductive film be 15-1,500 nm, and more preferably, 50-500 nm. When the height variation of the surface of the electrode is 20 nm or less, a device with stable characteristics can be obtained. For the oxide conductive film, ITO can be used, preferably having a tin oxide content of less than 5% by weight.

Coating the surface of the electrode by disposing a transparent coating film that contains a synthetic resin and has a volume resistance in the range of $10^2$-$10^{12}$ Ω·cm is effective in protecting the electrode. When the substrate is made of a synthetic resin, this coating of the substrate surface makes is possible to suppress change in the shape of the substrate caused by thermal expansion, as the electrode is then sandwiched between synthetic resin having similar coefficients of thermal expansion.

In order to function as a protection film for an easily damaged metal electrode, it is preferable that the thickness be 0.5 μm or greater. When used in a display panel, the thickness is preferably 5 μm or less so that image quality is not affected. As for volume resistance, when film thickness is 5 μm, it is preferable that volume resistance be $10^{12}$ Ω·cm or less. In the case of using a metal film for a transparent electrode, thickness of the metal film is preferably 20 nm or less, and more preferably, 10 nm.

Figure 1:
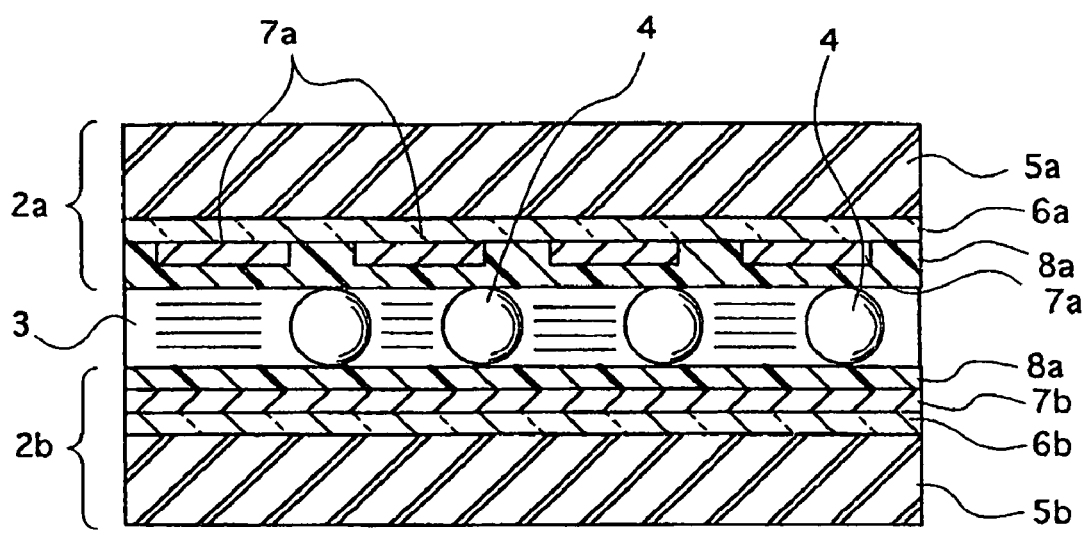
FIG. 1 is a longitudinal section schematically showing the construction of a liquid crystal display panel that utilizes substrates with electrodes of one example of the present invention.

REFERENCE NUMERALS 1 liquid crystal display panel
2a array substrate
2b counter substrate
3, 103 liquid crystal layer
4 spacer
5a, 5b, 105, 205 substrate
6a, 6b undercoat layer
7a, 7b electrode
8a, 8b, 108a, 108b alignment film
10 buffer layer
11 color filter layer
12 resin layer
13 insulating layer
100, 208 conductive coating film
101, 101a, 101b substrate with electrodes
102 metal film
102a, 202 transparent electrode
102b translucent electrode
109 polarizer
200 light-emitting region
204 light-emitting layer
205 electron transporting layer
206 hole injecting layer

BEST MODE FOR CARRYING OUT THE INVENTION

The preferred embodiments of the present invention are described in detail below with reference to the figures. In the following examples, substrates for liquid crystal display panels are used as examples of substrates with electrodes.

EXAMPLE 1

A liquid crystal display panel that utilizes substrates with electrodes of the present example is shown in FIG. 1.

As shown in FIG. 1, a liquid crystal display panel 1 has a pair of opposing substrates, specifically an array substrate 2a and a counter substrate 2b, and a liquid crystal layer 3 sandwiched between the substrates. The substrates 2a and 2b are held at a fixed distance from one another by spherical spacers 4.

The array substrate 2a has a substrate 5a, an undercoat layer 6a, serving as a gas barrier film, disposed on a surface of the substrate 5a opposed to the counter substrate 2b, film electrodes 7a made of a transparent conductive material, and an alignment film 8a made of polyimide or the like. Similarly, the counter substrate 2b has a substrate 5b, an undercoat layer 6b, serving as a gas barrier film, electrodes 7b, and an alignment film 8b.

The substrates 5a and 5b both have a thickness of 0.4 mm and are made of an acrylic resin having a glass transition temperature of 190° C. The undercoat layers 6a and 6b are both made of a silicon oxide film having a thickness of 20 nm that is formed by sputtering. Both the electrodes 7a and the electrodes 7b are made of an ITO film containing 5% by weight of tin oxide and having a thickness of 150 nm.

On a surface of the substrate 5a, under the conditions shown in Table 1, a film made of ITO containing 5% by weight of tin oxide was formed to a thickness of 150 nm by sputtering. Specifically, without heating the substrate 5a, the film was formed by sputtering on the surface at a rate of 6 nm/min. and under an atmosphere containing argon and oxygen at a pressure of $3.0 \times 10^{-3}$ Torr ($\approx 0.4$ Pa).

Through observation with a scanning electron microscope (SEM), it was confirmed that the formed ITO film had a structure such that microcrystalline grains having a grain size of 20-60 nm were dispersed in an amorphous matrix. With X-ray analysis, a clear diffraction peak was not confirmed.

Additionally, the substrate having the film formed thereon was heat treated in a vacuum for one hour at 180° C.

Figure 2:
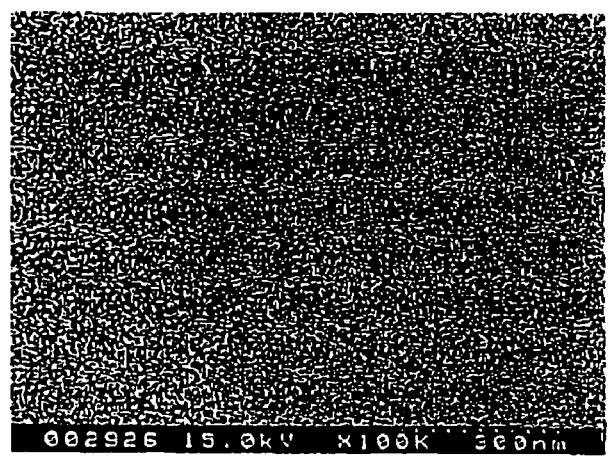
FIG. 2 is a scanning electron microscope picture showing the surface of an ITO thin film obtained in the same example.

Through X-ray analysis of the film after the heat treatment, clear diffraction peaks were confirmed, and it was further determined that crystal grains having an average grain size of 240 nm were contained in the film. An SEM picture of the surface of the film of the present example is shown in FIG. 2. Through SEM observation, it was confirmed that the film was an aggregate of crystal grains, i.e., a polycrystalline film, and that the film had a flat surface, the height variation of irregularities being 20 nm or less. In the surface of the film, although crystal grain boundaries could be confirmed, boundaries between regions in which crystal grains orient in approximately the same direction, i.e., domains, could not be discerned.

The resistivity of the film of the present example was $3.6 \times 10^4$ $\Omega \cdot$cm, and the transmissivity with respect to light having a wavelength of 400 nm was 83%. The film demonstrated excellent alkali resistance. After the formation of the film, almost no bend in the substrate 5a could be discerned, and good adhesion between the film and the substrate 5a was confirmed. By etching the film formed on the substrate 5a, a pattern for the electrodes 7a was processed, whereby the film was processed into a fine pattern with high precision.

Films having the same composition as the film of example 1, but having not been subject to crystallization by heating were used as comparative examples, and the characteristics of the films of each example were evaluated in the same manner. The results are shown in Table 1.

TABLE 1

|  | Example 1 | Comparative Example 1 | Comparative Example 2 |
| --- | --- | --- | --- |
| Film forming |  |  |  |
| thickness (nm) | 150 | 130 | 140 |
| substrate temperature (° C.) | — | 100 | 150 |
| gases introduced | Ar, O$_2$ | Ar, O$_2$ | Ar, O$_2$ |
| pressure (Torr*) | $3.0 \times 10^{-3}$ | $3.0 \times 10^{-3}$ | $2.0 \times 10^{-3}$ |
| speed (nm/min) | 6 | 6.5 | 7.5 |
| Crystallization treatment |  |  |  |
| temperature (° C.) | 180 | — | — |
| time (Hr) | 1 | — | — |
| atmosphere | vacuum | — | — |
| Film characteristics |  |  |  |
| resistivity (Ω · cm) | $3.6 \times 10^4$ | $5.0 \times 10^4$ | $2.2 \times 10^4$ |
| transmissivity (%) at 400 nm | 83 | 60 | 80 |

TABLE 1-continued

|  | Example 1 | Comparative Example 1 | Comparative Example 2 |
|---|---|---|---|
| crystal size (nm) | 240 | none | 30 |
| domains | none | none | observed |
| alkali resistance | good | poor | good |
| reliability | good | poor | fair |
| Substrate characteristics |  |  |  |
| bend | small | small | large |
| adhesion | good | good | poor |
| patternability | good | good | poor |

*1 Torr = 133.22 Pa

Figure 8:
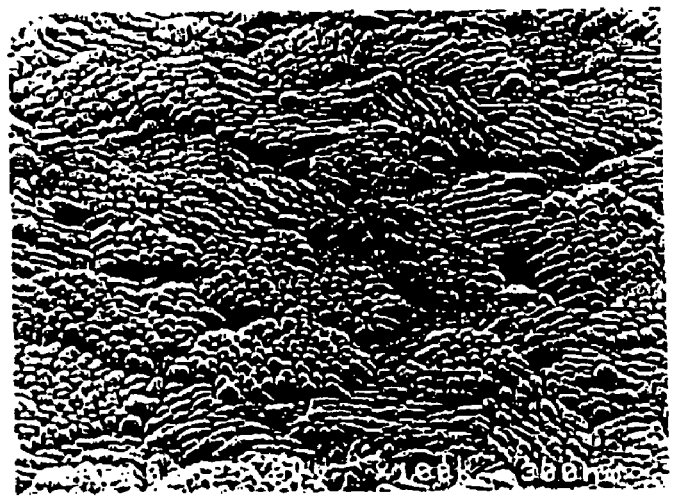
FIG. 8 is a scanning electron microscope picture showing the surface of an ITO thin film formed in a comparative example.

It was determined by X-ray analysis that the film of the Comparative Example 1 formed at a substrate temperature of 100° C. is an amorphous material from which a diffraction pattern cannot be substantially discerned. Thus, it is poor in terms of transmissivity and alkali resistance. The film of Comparative Example 2 formed at a substrate temperature of 150° C. is, as shown in FIG. 8, a polycrystalline film having a grain size of 30 nm, and while excellent in terms of resistivity, transmissivity, alkali resistance, and the like, the bend in the substrate is large and additionally, adhesion between the substrate and the film and patternability are poor.

In other words, the present example makes it possible to form, at a low temperature, a conductive film that is excellent in terms of a variety of properties such as resistivity, transmissivity, chemical resistance, corrosion resistance, patternability, and adhesion and to lessen the bend that arises in a substrate by the forming of such a film on the substrate.

EXAMPLE 2

In the present example, the present invention is described using a substrate for a color liquid crystal display panel as the example.

Figure 3:
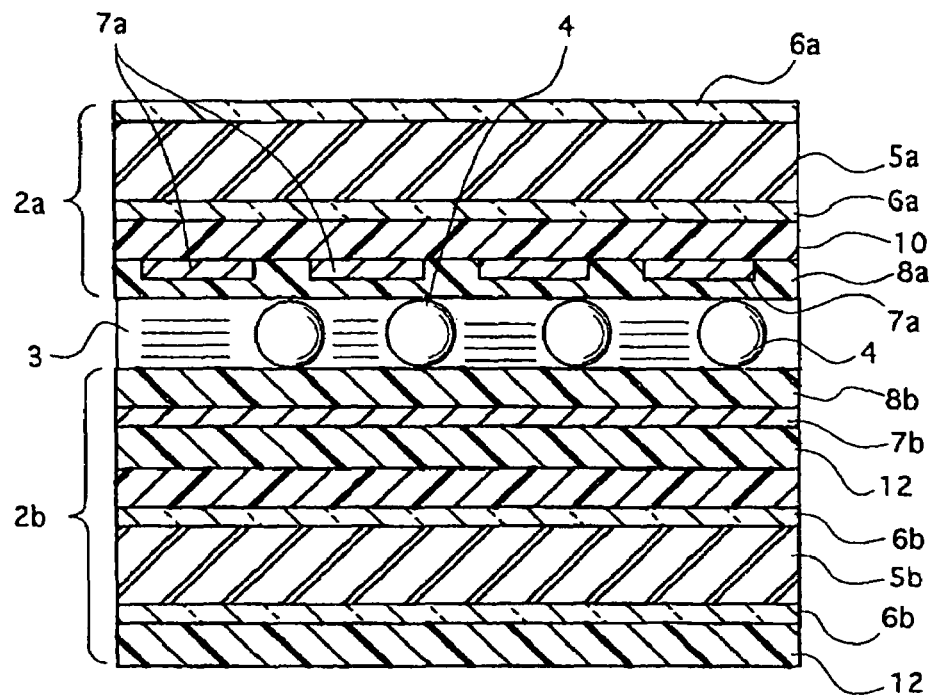
FIG. 3 is a longitudinal section schematically showing the construction of a liquid crystal display panel that utilizes substrates with electrodes of another example of the present invention.

The construction of a color liquid crystal display panel that utilizes substrates with electrodes of the present example is schematically shown in FIG. 3. As shown in the figure, an undercoat layer 6a is formed on either side of a substrate 5a, and an undercoat layer 6b is formed on either side of a substrate 5b, the undercoat layers 6a and 6b being made of, for example, silicon oxide. On a surface of the substrate 5a that is opposed to the substrate 5b, electrodes 7a made of a transparent conductive material are formed with a buffer layer 10 disposed therebetween.

At the same time, a color filter layer 11 made of an organic material is formed on a surface of the substrate 5b that is opposed to the substrate 5a. Over the color filter layer 11, electrodes 7b is formed with a resin layer 12, for forming a flat surface, disposed therebetween.

An array substrate 2a was fabricated utilizing a substrate 5a made of an epoxy resin having a glass transition temperature of 170° C. and having a thickness of 0.2 mm.

After immersing the substrate 5a in a polysilazane raw material solution (available from Tonen Chemical Corporation), the substrate 5a was heat treated for 1 hour at 120° C. and for 3 hours at 95° C. and 80% RH, whereby, on either surface of the substrate 5a, an undercoat layer 6a having a thickness of 30 nm and being made of silicon oxide was formed. On one of the surfaces of the substrate 5a, a cycloolefin resin raw material solution was then applied by spin coating, and the substrate was heated for 3 hours at 160° C. to form a buffer layer 10 having a thickness of 1 μM. On the surface of the substrate 5a having the buffer layer 10 formed thereon, an ITO film containing 3% by weight of tin oxide was formed by sputtering under the conditions shown in Table 2. Specifically, under an atmosphere in which argon has been introduced as the atmospheric gas to a pressure of 5.0×10$^{-3}$ Torr (≈0.67 Pa), an ITO film having a thickness of 210 nm was formed at a rate of 7 nm/min. by performing sputtering on the surface of the substrate 5a while heating the substrate at 80° C.

Meanwhile, on either surface of a substrate 5b similar to the substrate 5a, an undercoat layer 6b made of silicon oxide was formed in the same manner as was done with the substrate 5a, and subsequently, on one of the surfaces of the substrate 5b, a color filter layer 11 was formed by printing and carrying out heat treatment for 5 hours at 160° C. The substrate 5b was then immersed in acrylic resin raw material solution and heat treated for 3 hours at 160° C. to form a resin layer 12 for planarization. On a surface on the side of the substrate 5b having the color filter layer 11 formed thereon, an ITO film having a thickness of 210 nm was formed in the same manner as was done with the substrate 5a.

The ITO film formed over the substrate 5a and that formed over the substrate 5b had a structure such that microcrystalline grains having a grain size of approximately 30-120 nm were dispersed in an amorphous matrix, and an X-ray diffraction peak was not discerned. Subsequently, by carrying out heat treatment for 3 hours at 160° C. in the air, the ITO film was transformed into a polycrystalline film having an average crystal grain size of 200 nm or larger, having surface irregularities with a height variation of 20 nm or less, and having no domain boundaries.

The characteristics of the film and the substrate obtained were evaluated in the same manner as with Example 1. The results are shown in Table 2.

TABLE 2

|  | Example 2 |
|---|---|
| Film forming |  |
| thickness (nm) | 210 |
| substrate temperature (° C.) | 80 |
| gases introduced | Ar |
| pressure (Torr*) | 5.0 × 10$^{-3}$ |
| speed (nm/min) | 7 |
| Crystallization treatment |  |
| temperature (° C.) | 160 |
| time (Hr) | 3 |
| atmosphere | air |
| Film characteristics |  |
| resistivity (Ω · cm) | 3.5 × 10$^4$ |
| transmissivity (%) at 400 nm | 80 |
| crystal size (nm) | >200 |
| domains | none |
| alkali resistance | good |
| reliability | good |
| Substrate characteristics |  |
| bend | small |
| adhesion | good |
| patternability | good |

*1 Torr = 133.22 Pa

EXAMPLE 3

In the present example, the present invention is described using a substrate for a color liquid crystal display panel having another construction as an example.

Figure 4:
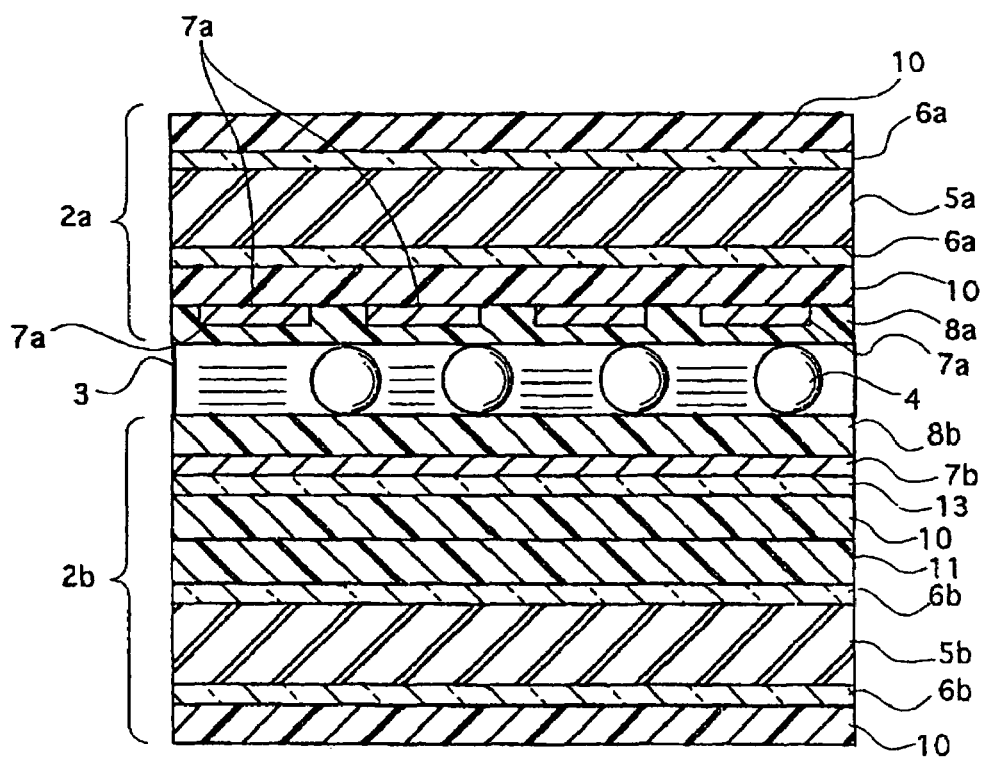
FIG. 4 is a longitudinal section schematically showing the construction of a liquid crystal display panel that utilizes substrates with electrodes of yet another example of the present invention.

The construction of a color liquid crystal display panel that utilizes substrates with electrodes of the present example is schematically shown in FIG. 4. An array substrate 2a is the same as that used in Example 2. On the other hand, a counter substrate 2b has a resin layer 12 for planarization formed only on the surface opposing the array substrate 2a. On the top surface, a buffer layer 10 like that provided over the array substrate 2a is formed.

Substrates 5a and 5b made of a silicon ladder-type cured silicone resin having a thickness of 0.35 mm and having a glass transition temperature of 200° C. were utilized to fabricate an array substrate 2a and a counter substrate 2b, respectively.

The array substrate 2a was fabricated in the following manner. On either side of the substrate 5a, an undercoat layer 6a having a thickness of 15 nm and being made of silicon oxide was formed by sputtering. On one of the surfaces of the substrate 5a, a buffer layer 10 having a thickness of 1 μm and being made of a cycloolefin resin was then formed in the same manner as Example 2. On the surface of the substrate 5a having the buffer layer 10 formed thereon, an ITO film containing 7% by weight of tin oxide was formed by sputtering under the conditions shown in Table 2. Specifically, under an atmosphere in which argon and oxygen has been introduced as atmospheric gases to a pressure of $5.0 \times 10^{-3}$ Torr ($\approx 0.67$ Pa), an ITO film having a thickness of 120 nm was formed at a rate of 6 nm/minute by performing sputtering on the surface of the substrate 5a while heating the substrate at 120° C.

Meanwhile, the counter substrate 2b was fabricated as described below. In the same manner as with the substrate 5a, an undercoat layer 6b made of silicon oxide was formed on either side of the substrate 5b, and subsequently, on one of the surfaces of the substrate 5b, a color filter layer 11 was formed by printing and carrying out heat treatment for 5 hours at 170° C. On the color filter layer 11, a cycloolefin resin raw material solution was applied by spin coating, and the substrate was heated for 3 hours at 170° C. to form a buffer layer 10 having a thickness of 1 μm. On the surface of the substrate 5b having the buffer layer 10 formed thereon, an insulating layer 13 having a thickness of 15 nm was formed by sputtering and on this, an ITO film containing 7% by weight of tin oxide was formed in the same manner as with substrate 5a.

The ITO film formed over the substrate 5a and that formed over the substrate 5b had a structure such that microcrystalline grains having a grain size of approximately 60-180 nm were dispersed in an amorphous matrix, and a clear X-ray diffraction peak was not discerned. Subsequently, by carrying out heat treatment for 1 hour at 170° C. in a vacuum, the ITO film was transformed into a polycrystalline film having an average crystal grain size of 100 nm, having surface irregularities with a height variation of 20 nm or less, and having no domain boundaries.

The characteristics of the film and the substrate obtained were evaluated in the same manner as with Example 1. The results are shown in Table 3.

TABLE 3

|  | Example 3 |
|---|---|
| Film forming |  |
| thickness (nm) | 120 |
| substrate temperature (° C.) | 120 |
| gases introduced | Ar, O$_2$ |
| pressure (Torr*) | $5.0 \times 10^{-3}$ |
| speed (nm/min) | 7 |
| Crystallization treatment |  |
| temperature (° C.) | 160 |
| time (Hr) | 3 |
| atmosphere | vacuum |
| Film characteristics |  |
| resistivity (Ω · cm) | $3.4 \times 10^4$ |
| transmissivity (%) at 400 nm | 82 |
| crystal size (nm) | 100 |
| domains | none |
| alkali resistance | good |
| reliability | good |
| Substrate characteristics |  |
| bend | small |
| adhesion | good |
| patternability | good |

*1 Torr = 133.22 Pa

EXAMPLE 4

Using glass substrates having a thickness of 0.4 mm for substrates 5a and 5b, an array substrate 2a and a counter substrate 2b were fabricated in the same manner as Example 1. The thickness of undercoat layers 6a and 6b was made to be 200 nm and the thickness of ITO films 200 nm.

The characteristics of the film and the substrate obtained are shown in Table 4. In addition, for Comparative Examples 3 and 4, a same glass substrate was used and a film was formed on each in the same manner as with Comparative Examples 1 and 2. The characteristics of these films and substrates are shown in Table 4.

EXAMPLE 5

Using glass substrates having a thickness of 0.55 mm for substrates 5a and 5b, an array substrate 2a and a counter substrate 2b were fabricated in the same manner as Example 2. The thickness of the formed ITO films was made to be 140 nm.

The characteristics of the film and the substrate obtained are shown in Table 4.

EXAMPLE 6

Using glass substrates having a thickness of 0.55 mm for substrates 5a and 5b, an array substrate 2a and a counter substrate 2b were fabricated in the same manner as Example 3. The thickness of ITO films formed was made to be 90 nm.

The characteristics of the film and the substrate obtained are shown in Table 4.

TABLE 4

| | Example 4 | Example 5 | Example 6 | Comparative Example 3 | Comparative Example 4 |
|---|---|---|---|---|---|
| Film forming | | | | | |
| thickness (nm) | 200 | 140 | 90 | 130 | 140 |
| substrate temperature (° C.) | — | 80 | 120 | 100 | 150 |
| gases introduced | Ar, $O_2$ | Ar | Ar, $O_2$ | Ar, $O_2$ | Ar, $O_2$ |
| pressure (Torr*) | $3.0 \times 10^{-3}$ | $5.0 \times 10^{-3}$ | $5.0 \times 10^{-3}$ | $3.0 \times 10^{-3}$ | $2.0 \times 10^{-3}$ |
| speed (nm/min) | 6 | 7 | 7 | 6.5 | 7.5 |
| Crystallization treatment | | | | | |
| temperature (° C.) | 180 | 160 | 160 | — | — |
| time (Hr) | 1 | 3 | 3 | — | — |
| atmosphere | vacuum | air | vacuum | — | — |
| Film characteristics | | | | | |
| resistivity ($\Omega \cdot cm$) | $3.6 \times 10^4$ | $3.5 \times 10^4$ | $3.4 \times 10^4$ | $5.0 \times 10^4$ | $2.2 \times 10^4$ |
| transmissivity (%) at 400 nm | 83 | 80 | 82 | 60 | 80 |
| crystal size (nm) | 240 | >200 | 100 | none | 30 |
| domains | none | none | none | none | observed |
| alkali resistance | good | good | good | poor | good |
| reliability | good | good | good | poor | fair |
| Substrate characteristics | | | | | |
| bend | small | small | small | small | large |
| adhesion | good | good | good | good | poor |
| patternability | good | good | good | good | poor |

*1 Torr = 133.22 Pa

As described in the examples above, the present invention makes it possible to form a conductive film that reduces the bend in a substrate and that shows good characteristics at a low temperature, by performing sputtering at a low temperature to form on a substrate a conductive film that is either amorphous or is such that crystal grains are contained only to the extent that a clear X-ray diffraction peak cannot be observed and by heat treating this film so that it is transformed into a polycrystalline film.

EXAMPLE 7

In the present example, a substrate with electrodes is described in which bend in the substrate is suppressed with even greater results.

Figure 5:
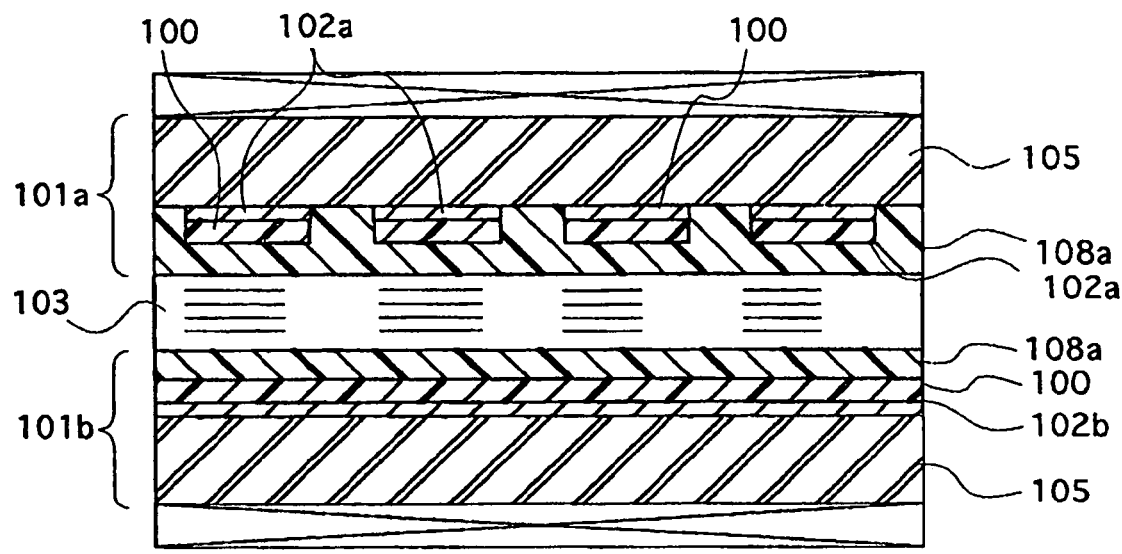
FIG. 5 is a longitudinal section schematically showing the construction of a liquid crystal display panel that utilizes substrates with electrodes of still another example of the present invention.

A schematic view of the substrate with electrodes of the present example is shown in FIG. 5. Transparent electrodes 102a formed on a surface of a substrate 105 made of a synthetic resin are covered with a conductive coating film 100 having a pattern that substantially matches up with the transparent electrodes.

Figure 6:
FIGS. 6a and 6b are each a longitudinal section schematically showing the state of a substrate in one step of a production method for the same substrate with electrodes.
Figure 6:
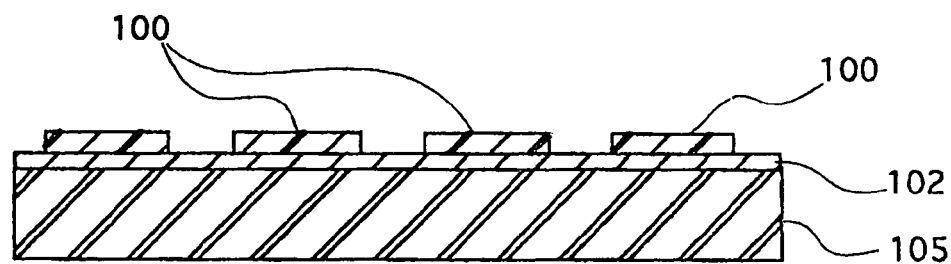

In the manner described as follows, a substrate 101a with electrodes and a substrate 101b with an electrode shown in FIG. 5 were formed. On a surface of a substrate 105 being made of acrylic resin, having a thickness of 0.2 mm, and having a square shape with a side length of 30 cm, a transparent metal film 102 having a thickness of 10 nm and being made of a silver alloy containing 1% by weight of each of palladium and copper was formed by sputtering without heating, as shown in FIG. 6a. The resulting metal film 102 had a transmissivity (at a wavelength of 400 nm) of 90% and a sheet resistance of approximately 3 $\Omega/\square$. This resistance is lower than that of an ITO polycrystalline film formed at a substrate temperature of 250° C. Though the transmissivity is slightly low, it is sufficient for usage. An acrylic-based positive resist having dispersed therein 50% by weight of ITO fine particles with a diameter of several nm was applied to the formed metal film 102, exposed, and heated at 170° C. to form a conductive coating film 100, as shown in FIG. 6b, made of a resist having a thickness of 1 μm and having a shape that substantially matches with the pattern of transparent electrodes 102a to be formed. Because of the presence of dispersed ITO fine particles, this conductive coating film 100 showed a low volume resistance of $10^{10}$ $\Omega \cdot cm$. The transmissivity was 95%. The conductive coating film 100 having been formed into a pattern was used as a mask and the metal film 102 was patterned using an etching liquid containing acetic acid, phosphoric acid, nitric acid, and water, thereby forming stripe transparent electrodes 102a. Because the conductive coating film 100 was mainly composed of a synthetic resin in order that its coefficient of linear thermal expansion be substantially equal to that of the substrate 105 made of a synthetic resin and because the metal film was thin in order to ensure transparency, bend in the substrate 105 was suppressed even with heating. Bend was not observed in the resulting substrate 101 at room temperature (25° C.).

When an ITO film having a thickness of 100 nm was formed on a same resin substrate at a substrate temperature of 140° C., the ITO film showed a low sheet resistance of 30 $\Omega/\square$, but a bend of approximately 5 mm was observed in the substrate having such a film formed thereon at room temperature. It is necessary that such a large bend be corrected before steps of patterning the ITO film or assembling the display panel. In addition, in transporting the substrate during commercial production, handling is extremely difficult because a special fixture for correcting to the bend is necessary and the like.

By contrast, because, in the present invention, bend is small under room temperature and even during heating, the production process is greatly simplified. Note that it is preferable that the forming of the metal film not only be carried out at 100° C. or less but be in the neighborhood of normal temperature. In addition, when the film thickness is thin, it is possible to have a small bend even at a slightly high temperature.

Figure 7:
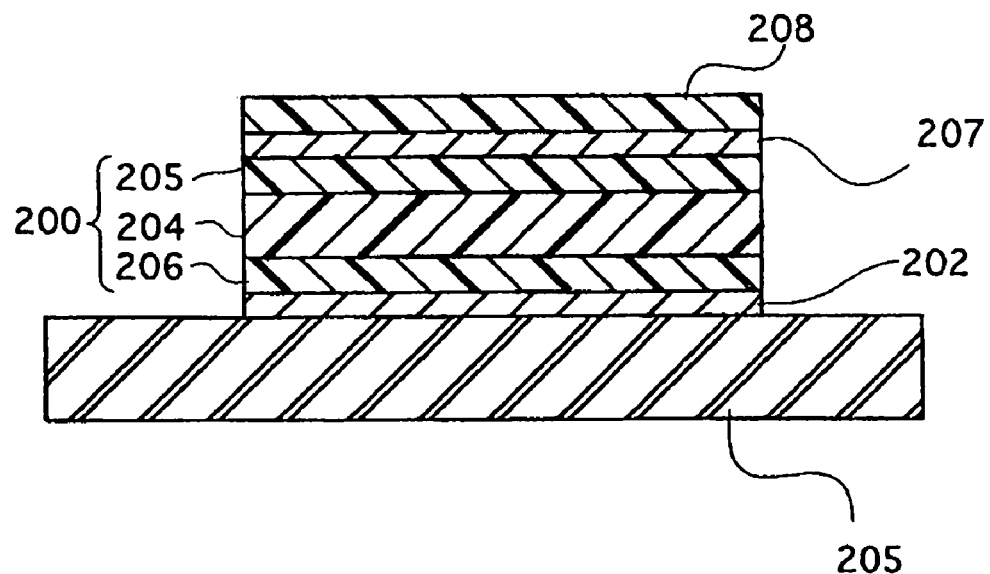
FIG. 7 is a longitudinal section schematically showing the construction of an organic EL display panel.

Using the resulting substrate with electrodes, a simple matrix liquid crystal display panel as shown in FIG. 7 was assembled. On a surface of a substrate 105a, transparent electrodes 102a and a conductive coating film 100 were formed in the manner described above. Similarly, a translucent electrode 102b having a thickness of 40 nm and a conductive coating film 100 were formed on a surface of a substrate 105b. The transmissivity of the transparent electrode 102b was 30% and the reflectivity 55%. On a surface of each of a pair of substrates 101a and 101b, alignment films 108a and 108b made of polyimide and having a thickness of 50 nm were applied and fabrication completed by rubbing, and a liquid crystal material was then injected between the substrates separated from one another by a distance of 4 µm to form a liquid crystal layer 103. On either side of this stacked structure, a polarizer 109 was attached, whereby a transflective liquid crystal panel was obtained. When the obtained liquid crystal panel was driven, variations in cell thickness could be suppressed because change in the shape of the substrate was minimal, and thus, better image quality could be displayed in a wide temperature range and in a wide viewing angle range of from −40 degrees to 70 degrees with respect to the liquid crystal panel screen than can be displayed by a liquid crystal panel utilizing a conventional ITO film for the electrodes and synthetic resin substrates for the substrates.

Because the volume resistance of the conductive coating film 100 is $10^{10}$ Ω·cm and the film thickness 1 µm, the film has a smaller impedance than that of the liquid crystal layer 103. Even if the film thickness is large, there is almost no image quality degradation caused by voltage division. As long as the volume resistance of the coating film 100 is approximately less than $10^{12}$ Ω·cm, image degradation is minimal. It is preferable that the resistance be low. At the present, however, it is difficult to obtain a resin coating film having a resistance of $10^2$ Ω·cm or less. An organic conductive material having such a low resistance, if available, may be used for the electrodes without using the coating film 100. Alternatively, using a resist resin for the resin coating film that covers the thin film metal electrodes, as is the case in the present example, makes it possible to, not only suppress bend, but to simplify the steps. Even if the resin coating film is not a resist, so long as it is provided with conductivity and transparency, the advantageous effect of suppression in bend in the substrate necessarily results because the coefficient of thermal expansion is similar to that of the resin substrate. In addition, pigment may be dispersed throughout the resin coating film such that specified colors of light only are transmitted.

It is even more effective to form such a film on a substrate of an organic EL device. In the case of a substrate for an organic EL device, generally, as is shown in FIG. 7, a transparent electrode 202 made of ITO or the like is formed on a substrate 205, and subsequently, a light-emitting layer 204, an electron transporting layer 205 made of an organic substance, and a hole injecting layer 206 made of an organic substance are formed to serve as a light-emitting region 200. A reflective electrode 207 made of aluminum or the like is then formed. A conductive coating film 208 may be formed, for example, as a resist for use during the forming of the reflective electrode. As for use of a resin substrate, no problems arise in the formation of the light-emitting region 200, which can be formed at a low temperature, but in the formation of the transparent electrode 202 that is made of ITO or the like and heated at a relatively high temperature, the substrate is subject to bend, also creating a non-symmetric structure. If anything, bend in the substrate that varies according to temperature is a more serious problem than in a liquid crystal display panel. The present invention makes it possible to realize an EL display device using resin substrates that has a small bend in the substrates in a wide temperature range and has excellent reliability. Note that in an EL device with a large driving current, there is a need for a resin coating film having a low resistance as compared with a liquid crystal display device, specifically, a resistance of at least $10^{10}$ Ω·cm or less. When a metal thin film is used for the transparent electrode, film thickness is made 20 nm or less, and preferably 10 nm or less.

INDUSTRIAL APPLICABILITY

With the present invention, a transparent conductive film that has various excellent properties can be formed at a low temperature. Furthermore, bend in a substrate on which such a film is formed can be suppressed during formation of the film. Therefore, provision of lightweight display devices having excellent reliability is realized.

What is claimed is:

1. A method of producing a substrate with an electrode, comprising the steps of:
   providing a substrate made of synthetic resin;
   forming an undercoat layer made of an organic material on a surface of the substrate to relieve stress caused by the difference in a coefficient of thermal expansion between the substrate and an electrode formed thereon;
   forming as the electrode an oxide conductive film consisting of an amorphous material or consisting essentially of an amorphous material on the substrate having formed thereon the undercoat layer at a temperature equal to or less than the crystallization temperature of the film; and
   crystallizing the oxide conductive film by heating.

2. The method of producing a substrate with an electrode according to claim 1, wherein in the step of forming an oxide conductive film, the oxide conductive film is heated at a temperature of 150° C. or less.

3. The method of producing a substrate with an electrode according to claim 1, wherein in the step of crystallizing the oxide conductive film, the oxide conductive film is heated at a temperature in the range of 150° C. to 200° C.

4. The method of producing a substrate with an electrode according to claim 1, wherein in the step of crystallizing the oxide conductive film, the oxide conductive film is heated at temperature equal to or less than the glass transition temperature of the substrate.

5. The method of producing a substrate with an electrode according to claim 1, wherein the step of crystallizing the oxide conductive film is carried out in an atmosphere free of oxygen.

6. The method of producing a substrate with an electrode according to claim 1, wherein the oxide conductive film is made of indium oxide having a portion substituted by tin.

7. The method of producing a substrate with an electrode according to claim 6, wherein the oxide conductive film has a tin oxide content of less than 5% by weight.

8. The method of producing a substrate with an electrode according to claim 1, wherein, in the oxide conductive film to be formed on the substrate, crystal grains having an average grain size of 200 nm or less are dispersed in an amorphous matrix.

9. The method of producing a substrate with an electrode according to claim 1, wherein, in the step of crystallizing the oxide conductive film, the oxide conductive film is transformed into an aggregate of randomly-oriented crystals having an average grain size of 20 nm or larger.

10. The method of producing a substrate with an electrode according to claim 9, wherein the average grain size of the crystals is 300 nm or less.

11. The method of producing a substrate with an electrode according to claim 1, wherein the thickness of the oxide conductive film is 500 nm or less.

12. The method of producing a substrate with an electrode according to claim 1, wherein, in the film completed by crystallization, the average grain size of crystal grains is in the range of 20 nm to 300 nm.

13. The method of producing a substrate with an electrode according to claim 1, further comprising a step of forming a transparent coating film on a surface of the electrode, the transparent coating film containing a synthetic resin and having a volume resistance in the range of $10^2 \Omega \cdot cm$ to $10^{12} \chi \cdot cm$.

14. The method of producing a substrate with an electrode according to claim 13, wherein after forming a layer made of a light-curing resin on the completed oxide conductive film and exposing regions of the layer corresponding to an electrode pattern for processing the oxide conductive film to cure and form the transparent coating film, the oxide conductive film is processed into the electrode by etching the oxide conductive film with the cured transparent coating film serving as a resist.

15. The method of producing a substrate with an electrode according to claim 13, wherein the thickness of the transparent coating film is in the range of 0.5 μm to 5 μm.

16. The method of producing a substrate with an electrode according to claim 13, wherein the thickness of the electrode is 20 nm or less.

* * * * *

UNITED STATES PATENT AND TRADEMARK OFFICE
CERTIFICATE OF CORRECTION

PATENT NO. : 7,250,326 B2 Page 1 of 1
APPLICATION NO. : 10/715854
DATED : July 31, 2007
INVENTOR(S) : Naomi Kaneko et al.

It is certified that error appears in the above-identified patent and that said Letters Patent is hereby corrected as shown below:

Column 17, lines 20-21:

change "102Ω·cm to 1012χ·cm" to --$10^2$Ω·cm to $10^{12}$Ω·cm--

Signed and Sealed this

Twenty-ninth Day of April, 2008

JON W. DUDAS
*Director of the United States Patent and Trademark Office*